United States Patent
Ohama

(10) Patent No.: US 8,277,559 B2
(45) Date of Patent: *Oct. 2, 2012

(54) QUARTZ GLASS CRUCIBLE FOR PULLING UP SILICON SINGLE CRYSTAL AND METHOD FOR MANUFACTURE THEREOF

(75) Inventor: Yasuo Ohama, Echizen (JP)

(73) Assignees: Heraeus Quarzglas GmbH & Co. KG, Hanua (DE); Shin-Estu Quartz Products Co., Ltd., Tokyo (JP)

( * ) Notice: Subject to any disclaimer, the term of this patent is extended or adjusted under 35 U.S.C. 154(b) by 819 days.

This patent is subject to a terminal disclaimer.

(21) Appl. No.: 10/555,853

(22) PCT Filed: Apr. 26, 2004

(86) PCT No.: PCT/JP2004/006020
§ 371 (c)(1),
(2), (4) Date: Nov. 1, 2005

(87) PCT Pub. No.: WO2004/097080
PCT Pub. Date: Nov. 11, 2004

(65) Prior Publication Data
US 2006/0236916 A1    Oct. 26, 2006

(30) Foreign Application Priority Data

May 1, 2003 (JP) ................. 2003-126490
May 20, 2003 (JP) ................. 2003-141702

(51) Int. Cl.
*C30B 35/00* (2006.01)

(52) U.S. Cl. .......... 117/208; 117/13; 117/200; 117/213; 117/900

(58) Field of Classification Search ............ 117/208, 117/13, 213, 200, 900
See application file for complete search history.

(56) References Cited

U.S. PATENT DOCUMENTS 5,174,801 A    12/1992  Matsumura et al.
(Continued)

FOREIGN PATENT DOCUMENTS

EP    1 319 736 A1    12/2002
(Continued)

OTHER PUBLICATIONS

Patent Abstracts of Japan, for JP 2003-095678 (Apr. 3, 2003).
(Continued)

*Primary Examiner* — Matthew Song
(74) *Attorney, Agent, or Firm* — Rader, Fishman & Grauer, PLLC; Carl Schaukowitch

(57) ABSTRACT

A quartz glass crucible which has a non-transparent outer layer formed through melting a natural silica powder and a transparent layer formed in the inside of the outer layer, wherein the transparent layer comprises a natural quartz layer having a thickness of 0.4 to 5.0 mm transparent layer comprising a synthetic quarts glass is formed thereon in the inside of the crucible in the range of 0.15 to 0.55 L relative to L, which is the distance from the center of the bottom of the inner surface of the quartz glass crucible to the upper end thereof along the inner surface thereof. The quartz glass crucible can be suitably used for suppressing the occurrence of vibration and reducing the generation of roughened face in the surface of a crucible, and thus for pulling up a silicon single crystal with enhanced stability.

12 Claims, 4 Drawing Sheets

U.S. PATENT DOCUMENTS

| | | | |
|---|---|---|---|
| 5,306,473 A * | 4/1994 | Nakajima et al. | 117/208 |
| 6,136,092 A * | 10/2000 | Sato et al. | 117/84 |
| 6,641,663 B2 * | 11/2003 | Kemmochi et al. | 117/200 |
| 6,841,210 B2 | 1/2005 | Ohama et al. | |
| 6,886,364 B2 | 5/2005 | Ohama et al. | |
| 2002/0192409 A1 * | 12/2002 | Ohama et al. | 428/34.6 |
| 2003/0012899 A1 * | 1/2003 | Kemmochi et al. | 428/34.6 |
| 2003/0074920 A1 | 4/2003 | Ohama et al. | |
| 2003/0106491 A1 | 6/2003 | Kemmochi et al. | |

FOREIGN PATENT DOCUMENTS

| | | |
|---|---|---|
| JP | 2811290 | 8/1998 |
| JP | 2933404 | 5/1999 |
| JP | 2001-348240 | 12/2001 |
| JP | 2001-348294 | 12/2001 |
| JP | 2002-284596 | 10/2002 |
| JP | 2003-95678 | 4/2003 |
| WO | WO 01/92169 A1 | 12/2001 |

OTHER PUBLICATIONS

Patent Abstracts of Japan, for JP 2001-348294 (Dec. 18, 2001).
Patent Abstracts of Japan, for JP05-105577 (Apr. 27, 1993).
Patent Abstracts of Japan, for JP 2002-284596 (Oct. 3, 2002).
Patent Abstracts of Japan, for JP08-169798 (Jul. 2, 1996).
Patent Abstracts of Japan, for JP 2001-348240 (Dec. 18, 2001).

* cited by examiner (a)

(b)

(c)

QUARTZ GLASS CRUCIBLE FOR PULLING UP SILICON SINGLE CRYSTAL AND METHOD FOR MANUFACTURE THEREOF

TECHNICAL FIELD

The present invention relates to a quartz glass crucible for pulling up a silicon single crystal and a process for producing the same.

JOINT RESEARCH AGREEMENT

The invention of this application was developed under a joint research agreement between Heraeus Quarzglas & Co. KG and Shin-Etsu Quartz Products, Ltd., to which a linked agreement was executed between Heraeus Quarzglas GmbH & Co., Shin-Etsu Quartz Products, Ltd., and Heraeus Shin-Etsu America, Inc.

BACKGROUND ART

A method which is called Czochralski method (CZ method) has heretofore widely been adopted in production of silicon single crystals. This CZ method is a method in which polycrystal silicon is melted in a crucible made of a quartz glass, a seed crystal of a silicon single crystal is dipped into this silicon melt and the seed crystal is gradually pulled up while rotating the crucible, to grow a silicon single crystal by employing a seed crystal as a nucleus. It is necessary that the single crystal produced by the above-mentioned CZ method is of high purity and is also enabled to produce a silicon wafer in high yield. As for a quartz glass crucible to be used in the production, a quartz glass crucible having a two layer structure comprising a transparent inner layer that does not contain bubbles and an opaque outer, layer that contains bubbles is generally used.

In recent years, as a silicon single crystal is made large in diameter, the time for the operation of pulling up of the single crystal becomes longer and the inner surface thereof contacts a silicon melt at a temperature of 1400° C. or higher for a long time. The inner surface thereof reacts with the silicon melt and crystallization occurs in a shallow layer of the inner surface, thereby causing the occurrence of brown cristobalite in the form of ring (hereinafter referred to as a brown ring). In the above-mentioned brown ring, there is no cristobalite layer or even if there is, it is a very thin layer, however, as the operating time elapses, the brown ring expands its size and continues to grow while fusing with each other. Finally, the central portion thereof is eroded to become an uneven glass dissolving surface. Once this glass dissolving surface emerges, dislocations are liable to be generated in a silicon single crystal, which entails inconvenience in the yield in the pulling up of a single crystal. In particular, in order to grow a silicon single crystal for producing a wafer with a large diameter of not smaller than 200 mm, it is necessary to perform the operation in the CZ method for more than 100 hours, whereby the emergence of the above-mentioned glass dissolving surface becomes prominent.

It is considered that the above-mentioned brown ring occurs by employing, as a nucleus, a minute scratch on the glass surface, a portion of crystalline residue, which is an undissolved residue of a raw material powder, a defect of the glass structure or the like. In order to reduce the number thereof, the condition of the glass surface is maintained good, melting is performed at a high temperature for a long time for reducing a crystalline residual component, or as described in Japanese Patent Nos. 2811290 and 2933404, an amorphous synthetic powder is used as a raw material powder for forming the inner surface thereof. With regard to a synthetic quartz glass made of the above-mentioned amorphous synthetic powder, there are advantages in that the content of impurities can be made extremely low and the occurrence of surface roughness or brown rings on the inner surface of a crucible in accordance with the pulling up of a silicon single crystal can be reduced. However, in the case where a transparent inner layer is composed of a synthetic quartz glass and an outer layer is composed of an opaque quartz glass made of natural quartz glass, the physical properties vary widely between the transparent inner layer and the outer layer such as the difference between the fact that one is transparent and the other is opaque and the difference between the fact that one is made of a synthetic substance and the other is made of a natural one, therefore distortion is generated at the boundary between both layers. In particular, there was a problem of deformation or peel-off of the transparent inner layer at a bent portion of a crucible to which a high heat load by a heater was applied and which was contacted with a silicon melt for a long time in some cases. In addition, a crucible comprising a transparent inner layer made of a synthetic quartz glass had a drawback in that when a polysilicon was melted, the surface of the melt was liable to vibrate compared with a crucible comprising a transparent inner layer made of natural quartz glass. This vibration was frequently observed particularly at the time from seeding to shoulder formation and in the step of pulling up a front half portion of a single crystal body at an initial stage; therefore, it took a long time to perform seeding, a crystal was disordered and melted again, that is, so-called melt back occurred, and soon, whereby the productivity was decreased in some cases. Therefore, as disclosed in JP-A-2001-348294, a crucible with a multilayer structure having an opaque intermediate layer made of a synthetic quartz glass between a transparent inner layer made of a synthetic quartz glass and an opaque bulk layer made of natural quartz glass has been proposed, however, there was a drawback in that since a large amount of expensive synthetic quartz powder was used for the crucible with a multilayer structure, the price of the quartz glass crucible was high.

The present inventors have continued intensive studies in order to overcome the above-mentioned drawbacks, and as a result, they found that the yield in the pulling up of a single crystal is deeply related to the inner surface of the bent portion of a quartz glass crucible and vibration occurring on the surface of a silicon melt is deeply related to the inner surface of the straight body portion thereof, and a high yield in the pulling up of a silicon single crystal can be achieved by forming the inner surface at least at the vicinity of the bent portion in a quartz glass crucible to be used for pulling up a silicon single crystal with a transparent layer made of a synthetic quartz glass, in addition, a problem such as deformation or peel-off of the inner layer can be solved by interposing a transparent layer made of natural quartz glass between a transparent layer made of a synthetic quartz glass and an opaque outer layer made of natural quartz glass, further, the occurrence of vibration on the surface of a silicon melt can be suppressed by forming the inner surface of the straight body portion with natural quartz glass or with a very thin synthetic quartz glass layer.

On the other hand, when the number of brown rings occurring on the inner surface of a crucible in the CZ method is reduced, the surface of a silicon melt is liable to vibrate at the time of pulling up a crystal; therefore there is a problem of deterioration of workability. As a solution thereof, it was fount that when the ratio of the number of brown rings occurring in the range from the initial surface level of a silicon melt in the pulling up of a single crystal to 0.3 M in terms of a length M from the initial surface level of the silicon melt to the surface level of the remaining melt after pulling up a single crystal measured along the inner surface of a quartz glass crucible to the number of brown rings occurring in the range up to 0.3 M from the surface level of the remaining melt after pulling up is set in a specific range or higher, vibration on the surface of the melt does not occur and the yield in the pulling up of a single crystal becomes high.

Accordingly, an object of the present invention is to provide a quartz glass crucible for pulling up a silicon single crystal in which the occurrence of vibration on the surface of a melt is suppressed, the occurrence rate of surface roughness on the inner surface of a crucible is low even in a long time operation, and a silicon silicon single crystal can be stably pulled up.

In addition, an object of the present invention is to provide a method that can produce a quartz glass crucible for pulling up a silicon single crystal having the above-mentioned excellent properties at low cost.

DISCLOSURE OF THE INVENTION

The present invention firstly relates to a quartz glass crucible for pulling up a silicon single crystal, which has an opaque outer layer formed by melting natural silica powder and a transparent layer formed on the inside thereof, in which the transparent layer is a layer with a thickness of 0.4 to 5.0 mm made of natural quartz glass, and a transparent layer made of a synthetic quartz glass is formed on the inside of the crucible in the range from at least 0.15 to 0.55 L in terms of a distance L from the center of the bottom of the inner surface of the quartz glass crucible to the upper end face along the inner surface of the crucible.

The present invention secondly relates to a quartz glass crucible for pulling up a silicon single crystal, which has an opaque outer layer made of natural quartz glass and a transparent layer formed on the inside thereof, in which the number of brown rings per unit area ($cm^2$) observed in the range from the initial surface level of a silicon melt to 0.3 M in terms of a length M from the initial surface level of the silicon melt to the surface level of the remaining melt after pulling up a single crystal measured along the inner surface of the quartz glass crucible is 1.8-fold or more greater than 15 brown rings observed in the range up to 0.3 M above the surface level of the remaining melt.

The present invention thirdly relates to a method for producing the above-mentioned quartz glass crucible for pulling up a silicon single crystal.

The first quartz glass crucible of the present invention is, as described above, a quartz glass crucible in which a transparent Layer made of natural quartz glass is provided on the inside of an opaque outer layer made of natural quartz glass, a transparent layer made of a synthetic quartz glass is formed on the inside of the crucible in the range from at least 0.15 to 0.55 L in terms of a distance (L) from the center of the bottom of the transparent layer to the upper end face along the inner surface of the crucible, distortion at the boundary between the transparent layer made of a synthetic quartz glass and the opaque outer layer made of natural quartz glass is alleviated, and deformation or peel-off of the transparent layer does not occur. The thickness of the above-mentioned transparent layer made of natural quartz glass may be in the range from 0.4 to 5.0 mm, preferably from 0.7 to 4.0 mm. When the thickness of the transparent layer made of natural quartz glass is in the above-mentioned range, the function as a buffering portion is optimized. In addition, the transparent layer made of a synthetic quartz glass is not formed in the range from 0.6 to 1.0 L in terms of a distance (L) from the center of the bottom of the inner surface of the crucible to the upper end face along the inner surface of the crucible, or even if it is formed, the thickness thereof is set to 0.2 mm or less. By forming a transparent layer made of natural quartz glass, not of a synthetic quartz glass, on the inner surface in the above-mentioned range, vibration of a silicon melt can be suppressed. Further, even if a transparent layer made of a synthetic quartz glass is formed, if the thickness thereof is 0.2 mm or less, the transparent layer made of a synthetic quartz glass is melted and damaged by the time of melting a polysilicon (meltdown) and starting the pulling up, and the natural quartz glass layer is exposed, whereby vibration of a silicon melt can be suppressed. In this case, compared with a case where a transparent layer made of a synthetic quartz glass is not formed, the amount of natural quartz glass melted in a silicon melt during the melt down is small, therefore, impurities melted in the silicon melt can be reduced.

Incidentally, the yield in the pulling up of a silicon single crystal varies depending on dislocation generation in a single crystal, however, it is mostly generated in the latter half of the pulling up step, namely it is caused by surface roughness on the inner surface or peel-off of the inner layer which occurs in the range from the bent portion to the vicinity of the bottom of a quartz glass crucible (in the range from at least 0.15 to 0.55 L in terms of a distance L from the center of the bottom of the inner surface of the crucible to the upper end face along the inner surface thereof) which is contacted with a silicon melt for a long time and to which a high heat load by a heater is applied. Therefore, by forming the inner surface in the above-mentioned range with a transparent layer made of a synthetic quartz glass, surface roughness or peel-off of the inner layer can be significantly reduced. Further, the used amount of a synthetic quartz powder can be reduced, and the cost for producing a quartz glass crucible can be reduced. The thickness of the above-mentioned transparent layer made of a synthetic quartz glass may be in the range from 0.2 to 1.5 mm. If the thickness is less than 0.2 mm, the effect on suppressing surface roughness or peel-off of the inner layer is small, and even if a layer with a thickness of more than 1.5 mm is formed, the effect on suppressing surface roughness or peel-off of the inner surface does not change, but the cost for producing a quartz glass crucible is increased instead, therefore it is not preferred.

In the above-mentioned first quartz glass crucible of the present invention, it is preferred that the OH group concentration in the opaque outer layer made of natural quartz glass is set to low in order to prevent deformation at the time of use at a high temperature. The OH group concentration in this opaque outer layer may be set from 20 to 60 ppm in terms of an average OH group concentration $C_C$. On the other hand, the OH group concentration in the transparent layer made of a synthetic quartz glass may be set to high, namely from 100 to 300 ppm in terms of an average OH group concentration $C_A$ in order to improve wettability with a silicon melt. However, in the case where the OH group concentration in the inner layer is higher compared with the opaque outer layer, rapid infrared ray absorption occurs at the boundary where the outer layer meets the inner layer, and a load is applied to the boundary, whereby the occurrence frequency of such as deformation or peel-off is further increased. Accordingly, in this quartz glass crucible of the present invention, the OH group concentration in the transparent inner layer made of natural quartz glass provided between the outer layer and the transparent layer is set from 60 to 150 ppm in terms of an average OH group concentration $C_B$, which is a mean value of those for the above-mentioned outer layer and transparent layer, and they are made to satisfy the relation: $C_A>C_B>C_C$, whereby the occurrence frequency of deformation or peel-off of the inner layer can be reduced. For adjusting the average OH group concentration $C_A$ in the above-mentioned transparent layer to a high concentration of 200 mm or higher, a method for introducing water vapor in the inside of the crucible as described in JP-A-2001-348240 or the like may be adopted.

The second quartz glass crucible of the present invention is, as described above, a quartz glass crucible for pulling up a silicon single crystal, which has an opaque outer layer made of natural quartz glass and a transparent layer formed on the inside thereof, in which the number of brown rings per unit area (cm$^2$) observed in the range from the initial surface level of a silicon melt to 0.3 M in terms of a length M from the initial surface level of the silicon melt to the surface level of the remaining melt after pulling up a single crystal measured along the inner surface of the quartz glass crucible is 1.8-fold or more, preferably 2.5-fold or more greater than the number of brown rings observed in the range up to 0.3 M above the surface level of the remaining melt. The above-mentioned brown ring is a cristobalite brown ring as described above, and in the initial stage of the occurrence thereof, as shown in FIG. 4(a), there is no cristobalite layer or even if there is, it is a very thin layer. As the operating time of pulling up a single crystal elapses, that is, as the time of contacting a crucible with a silicon melt is increased, the brown ring expands its size and a crystalline texture emerges as shown in FIG. 4(b). Pulling up of a single crystal is further continued, and when the reaction between the silicon melt and the crucible proceeds, the portion encircled by the brown ring as shown in FIG. 4(c) is gradually eroded to become a rough glass dissolving surface (amorphous). In FIG. 4, 17 indicates the inner surface of a crucible, 18 indicates a brown ring, 19 indicates a crystalline texture, and 20 indicates a glass dissolving surface. Once this glass dissolving surface emerges, dislocations are liable to be generated in a silicon single crystal, and the rate of single crystallization is decreased.

The above-mentioned number of brown rings is the number per unit area (cm$^2$) calculated by dividing the counted number of brown rings observed in arbitrary three locations with a width of 10 cm in the circumferential direction of the crucible by the measured area. In the vicinity of the remaining melt which is contacted with the silicon melt in the crucible for a long time and on which a brown ring is liable to grow, brown rings are fused to each other in some cases. In this case, however, the area per one brown ring is calculated from the average size of a single brown ring observed in the measured range, the value obtained by dividing the area of the fused portion by the area per one brown ring is defined as the number of brown rings in the fused portion.

In the quartz glass crucible to be used in the CZ method, vibration on the surface of a silicon melt in the CZ method occurs particularly frequently in the range where the surface level of the melt is from the initial surface level of the melt to 0.3 M, however, by increasing the number of brown rings only in the range, the above-mentioned vibration occurring on the surface of a silicon melt can be suppressed. In addition, since the above-mentioned range is contacted with the silicon melt for a short time, a brown ring is small in size and in a state as shown in FIG. 4a, and a glass dissolving surface does not occur, therefore, even if the number of brown rings is increased, there is no effect on the yield in the pulling up of a single crystal.

On the other hand, dislocations in a silicon single crystal are mostly generated in the range up to 0.3 M above the surface level of the remaining melt, however, this range is contacted with the silicon melt for a long time, therefore, a brown ring grows there and a glass dissolving surface as shown in FIG. 4(c) is liable to occur. Accordingly, by decreasing the number of brown rings in this range, the occurrence of the glass dissolving surface can be suppressed, and the yield in the pulling up of a single crystal can be improved. In addition, even if the number of brown rings in this range is decreased, there is no effect on vibration of the silicon melt.

In the CZ method, the number of brown rings may slightly vary depending on the conditions of pulling up a single crystal even if the same crucible is used, however, the number of brown rings per unit area (cm$^2$) observed in the range from the initial surface level of a silicon melt to 0.3 M in terms of a length M from the initial surface level of the silicon melt to the surface level of the remaining melt after pulling up a single crystal measured along the inner surface of the crucible is set to 1.8-fold or more, preferably 2.5-fold or more greater than the number of brown rings observed in the range up to 0.3 M above the surface level of the remaining melt. By doing so, vibration occurring on the surface of the silicon melt can be suppressed, and the yield in the pulling up of a silicon single crystal can be increased. In particular, the number of brown rings observed in the range from the initial surface level of the melt to 0.3 M is from 2.0 to 5.0/cm$^2$, vibration occurring on the surface of the silicon melt can be surely suppressed. In addition, the number of brown rings observed in the range up to 0.3 M above the surface level of the remaining melt is from 0.02 to 0.9/cm$^2$ or less, the yield of silicon single crystal becomes a high level. Further, in the case where dislocations are generated in a single crystal due to a trouble in the latter half of the step of pulling up a silicon single crystal, the crystal is melted again and pulled up again, that is, so-called melt back is carried out in come cases, however, when this melt back is carried out or multiple pulling up in which several single crystals are pulled up from one crucible is carried out, the number of brown rings is increased, fusion of brown rings proceeds, and calculation of the number becomes difficult. In the case where pulling up is carried out without carrying out melt back, or in a state after the first pulling up for multiple pulling up is carried out, if a crucible in which the number of brown rings is in the above-mentioned range is used, favorable pulling up can be achieved compared with a crucible in which the number of brown rings is outside of the above-mentioned range even when melt back is carried out or multiple pulling up is carried out. Therefore, the calculation of the number shall be carried out for the inner surface of a crucible after one single crystal is pulled up without carrying out melt back.

BEST MODE FOR CARRYING OUT THE INVENTION

The present invention will be explained with reference to the accompanying drawings for describing in more detail.

Figure 1:
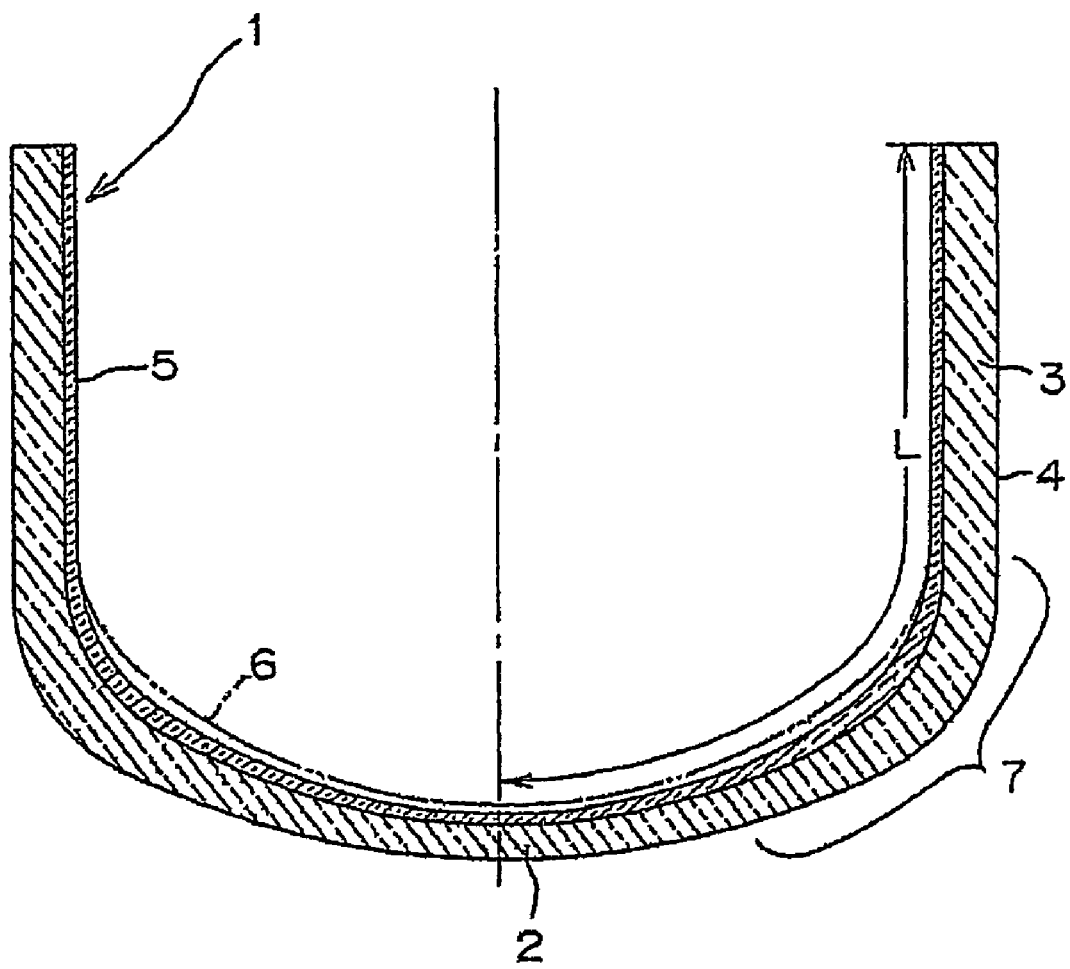
FIG. 1 is a schematic sectional view of a first quartz glass crucible of the present invention.
Figure 2:
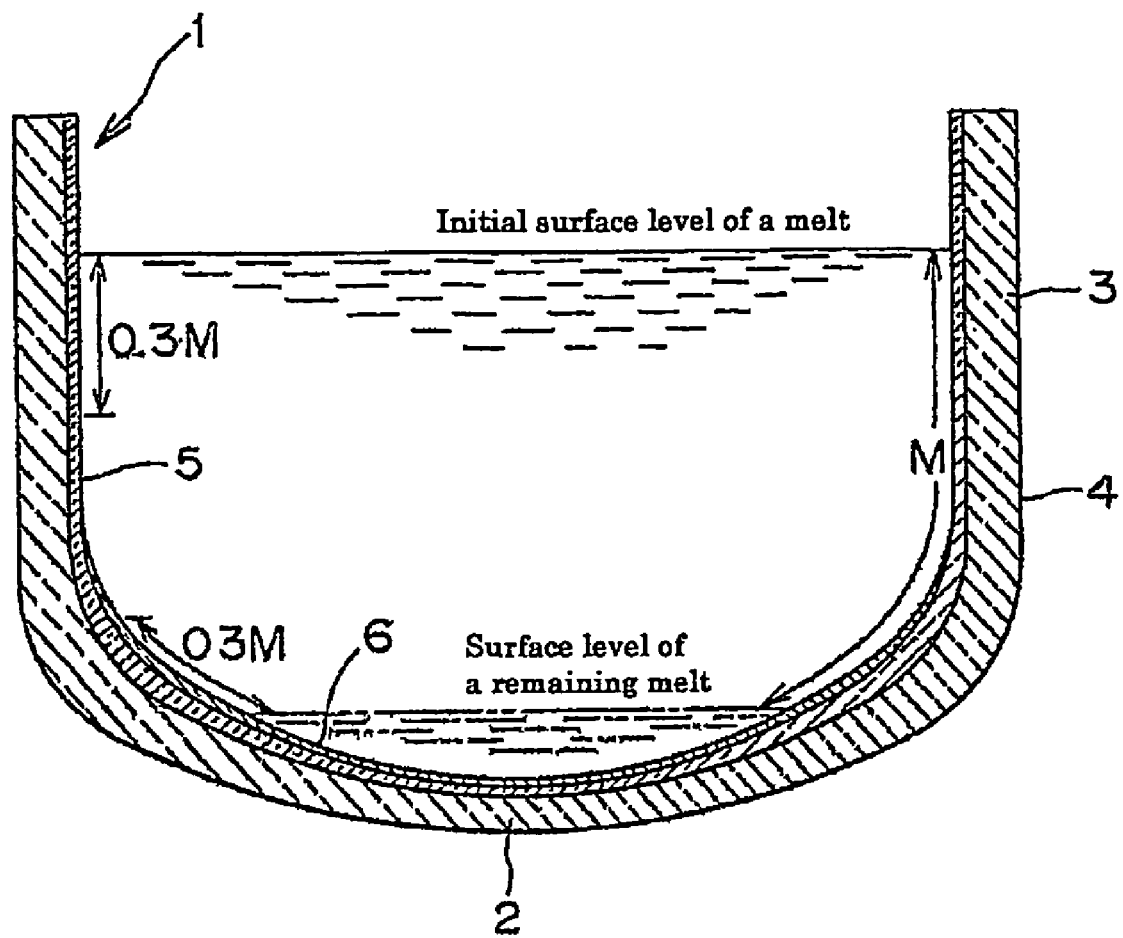
FIG. 2 is a schematic sectional view of a second quartz glass crucible of the present invention.

In FIGS. 1 and 2, 1 indicates a quartz glass crucible, 2 indicates a bottom of the crucible, 3 indicates a straight body portion, 4 indicates an opaque outer layer made of a synthetic quartz glass, 5 indicates a transparent layer made of natural quartz glass, 6 indicates a transparent layer made of a synthetic quartz glass and 7 indicates a bent portion. The first quartz glass crucible of the present invention is, as shown in FIG. 1, a quartz glass crucible having an opaque outer layer formed by melting natural silica powder and a transparent layer with a thickness of 0.4 to 5.0 mm made of natural quartz glass formed on the inside thereof, in which a transparent layer made of a synthetic quartz glass is formed on the inside of the crucible in the range from at least 0.15 to 0.55 L in terms of a distance L from the center of the bottom of the inner surface of the quartz glass crucible to the upper end face along the inner surface of the crucible. In addition, the second quartz glass crucible of the present invention is, as shown in FIG. 2, a quartz glass crucible having an opaque layer made of natural quartz glass and a transparent layer made of quartz glass formed on the inside thereof, in which the inner surface of the crucible in the range from the initial surface level of the melt to 0.3 M is formed with a transparent layer made of natural quartz glass or a mixture of natural and synthetic quartz glasses, the inner surface of the crucible in the range up to 0.3 M above the surface level of the remaining melt is formed with a transparent layer made of a synthetic quartz glass, and the inner surface of the crucible in the range other than above is formed with a transparent layer made of any of natural quartz glass, a mixture of natural and synthetic quartz glasses and a synthetic quartz glass. The above-mentioned first and second quartz glass crucibles are produced by using an apparatus shown in FIG. 3. More specifically, it is a method in which natural silica powder is fed into a rotatable mold 8, and molded in the form of a crucible, then, an arc electrode 14 is inserted in the article, and the opening portion of the crucible-like molded article is covered with a plate-like lid 11, then, an inner cavity of the crucible-like molded article is made a high temperature gas atmosphere 16 by the arc electrode 14 and at least a portion of the inner cavity is melted and vitrified to form an opaque crucible base body, subsequently, a synthetic silica powder is fed to the high temperature atmosphere 16 from a silica powder feeding device 15, and melted and vitrified to form a transparent layer 6 made of a synthetic quartz glass on the inner surface of the crucible; or, after or during the formation of the opaque crucible base body, natural silica powder of high purity or a mixture of natural and synthetic silicas is fed to the high temperature atmosphere 16 from a silica powder feeding device 10 while regulating the feed rate with a feed rate regulating valve 12, and melted and vitrified to form a transparent layer 5 made of natural quartz glass or a mixture of natural and synthetic quartz glasses in the range at least from the initial surface level of the melt to 0.3 M, and further a synthetic silica powder is fed to the high temperature atmosphere 16 from the silica powder feeding device 15, and melted and vitrified to form a transparent layer 6 made of a synthetic quartz glass in the range at least up to 0.3 M above the surface level of the remaining melt excluding the range from the initial surface level of the melt to 0.3 M of the inner surface of the crucible. In particular, with regard to the method for producing the second quartz glass crucible, it can also be produced by a method in which the entire inner layer of the crucible is composed of a synthetic quartz glass, the inner surface of the crucible in the range from the initial surface level of the melt to 0.3 M is subjected to an etching treatment or a sandblast process to make minute scratches, and the number of brown rings is increased to adjust the ratio of the number of brown rings in the range from the initial surface level of the melt to 0.3 M to the number of brown rings in the range up to 0.3 M above the surface level of the remaining melt to 1.8-fold or more, preferably 2.5-fold or more.

EXAMPLES

Hereunder, the present invention will be explained more specifically with reference to Examples, however, the present invention is not limited to these.

Example 1

Figure 3:
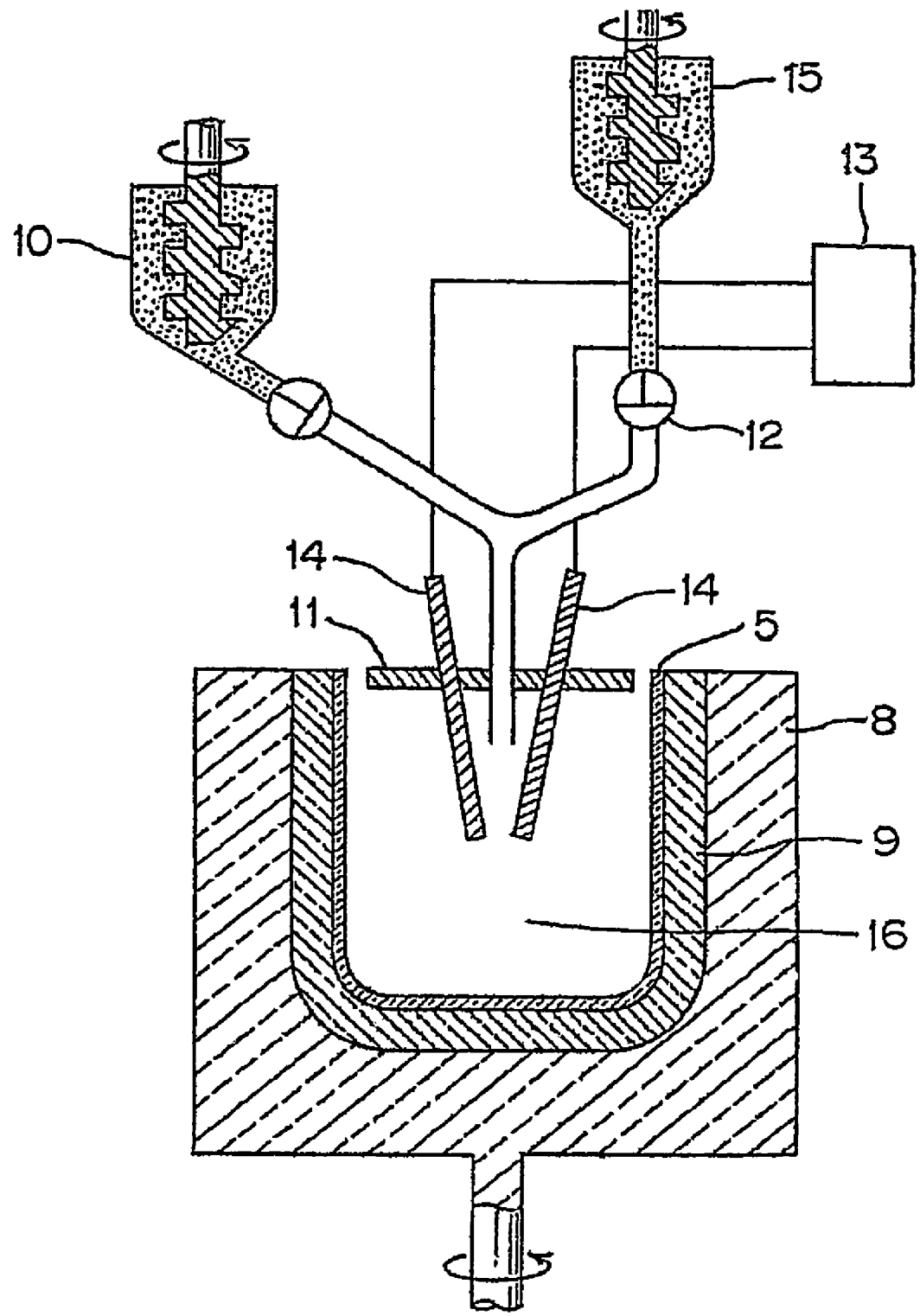
FIG. 3 is a schematic view of an apparatus for producing the above-mentioned quartz glass crucible.
Figure 4:
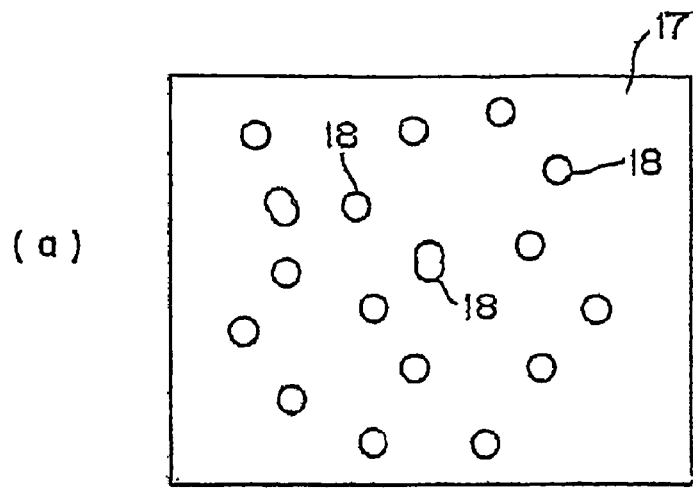
FIG. 4 is a partial plan view of an inner surface of a quartz glass crucible showing the occurrence of brown rings which are generated in the CZ method.
Figure 4:
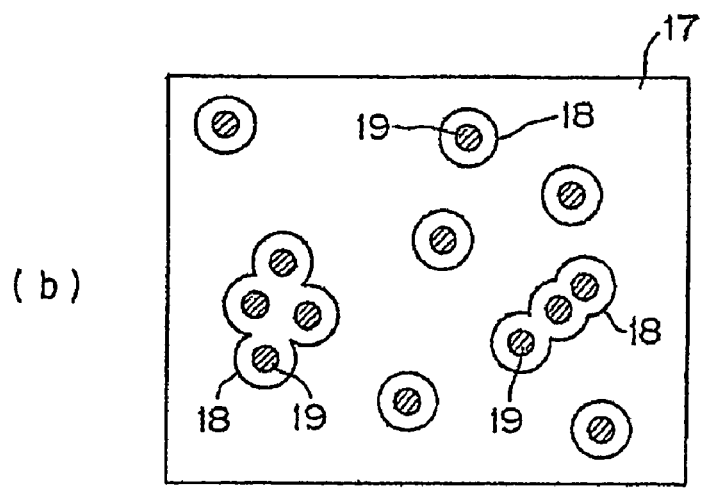
Figure 4:
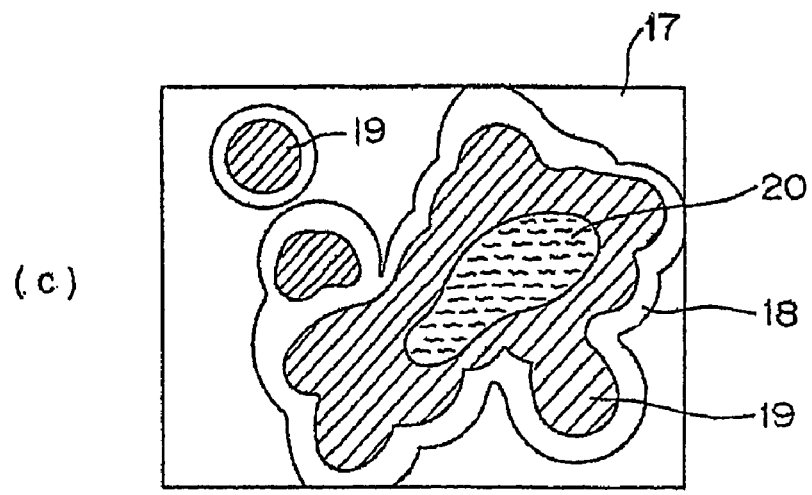

By using an apparatus shown in FIG. 3, natural silica powder of high purity subjected to a purification treatment was fed into a rotatable mold 8, and a crucible-like molded article 9 was formed by utilizing centrifugal force. Then, an arc electrode 14 was inserted in the article, and the opening portion was covered with a plate-like lid 11. Then, the inside of the inner cavity was made a high temperature gas atmosphere by the arc electrode 14, melted and vitrified, and then cooled, whereby an opaque outer layer 4 with a thickness of 8 to 10 mm was produced. Subsequently, the inner cavity of the opaque outer layer 4 was made a high temperature atmosphere 16 by the arc electrode 14 while rotating the mold 8, and then natural silica powder was fed at 100 g/min from a silica powder feeding nozzle 15, whereby a transparent layer 5 with a thickness of 0.9 to 2 mm made of natural quartz glass was fused and integrated to the inner surface of the opaque outer layer 4. Subsequently, a synthetic silica powder was fed at 100 g/min from the silica powder feeding nozzle 15, whereby a transparent layer 6 made of a synthetic quartz glass was fused and integrated to the above-mentioned transparent layer at a thickness of 0.5 to 1.2 mm, at a thickness of 0.2 to 0.5 mm, and at a thickness of 0.1 to 0.2 mm in the range up to 0.55 L, in the range from 0.55 to 0.6 L and in the range from 0.6 to 1.0 L, respectively in terms of a distance (L) from the center of the bottom of the transparent layer to the upper end face along the inner surface of the crucible. The diameter of the obtained quartz glass crucible was 24 inches, and the average OH group concentration $C_C$ in the opaque outer layer 4 made of natural quartz glass was 40 ppm, the average OH group concentration $C_B$ in the transparent layer 5 made of natural quartz glass was 110 ppm and the average OH group concentration $C_A$ in the transparent layer 6 made of a synthetic quartz glass was 220 ppm. When a polycrystal silicon was fed into this quartz glass crucible and melted, and pulling up of a single crystal was carried out at N=5 by the CZ method, vibration of the silicon melt was not observed in any case, and further, the average of rate of single crystallization of the obtained silicon single crystal was 92%, which showed a high yield.

Examples 2 to 5

In Example 1, the transparent layer 5 made of natural quartz glass and the transparent layer 6 made of a synthetic quartz glass, which form the inner surface of a quartz glass crucible, were fused and integrated so as to have a thickness shown in Table 1, respectively, whereby a 24-inch quartz glass crucible was produced. The average OH group concentration in each layer of the produced quartz glass crucible was as shown in Table 1. By using this quartz glass crucible, pulling up of a silicon single crystal was carried out in the same manner as in Example 1. The results are shown in Table 1.

TABLE 1

|  |  | Example 2 | Example 3 | Example 4 | Example 5 |
|---|---|---|---|---|---|
| Transparent layer made of synthetic quartz glass | Thickness | 0 to 0.55 L: 1 to 3 mm; 0.55 to 0.6 L: 0.2 to 1 mm; 0.6 to 1 L: 0.1 to 0.2 mm | 0 to 0.1 L: 0 mm; 0.1 to 0.15 L: 0 to 0.3 mm; 0.15 to 0.55 L: 0.3 to 1.2 mm; 0.55 to 0.6 L: 0.2 to 0.4 mm; 0.6 to 1 L: 0.1 to 0.2 mm | 0 to 0.55 L: 0.3 to 0.8 mm; 0.55 to 0.6 L: 0 to 0.3 mm; 0.6 to 1 L: 0 mm | 0 to 0.55 L: 0.3 to 0.8 mm; 0.55 to 0.6 L: 0 to 0.03 mm; 0.6 to 1 L: 0 mm |
|  | OH group | 220 ppm | 220 ppm | 150 ppm | 150 ppm |
| Transparent inner layer made of natural quartz glass | Thickness | 0.7 to 1 mm | 0.9 to 2 mm | 1 to 3 mm | 1 to 3 mm |
|  | OH group | 110 ppm | 110 ppm | 80 ppm | 80 ppm |
| Opaque outer layer made of natural quartz glass | Thickness | 8 to 10 mm | 8 to 10 mm | 8 to 10 mm | 8 to 10 mm |
|  | OH group | 40 ppm | 40 ppm | 40 ppm | 100 ppm |
| Number of pulling up operations |  | 5 | 5 | 5 | 5 |
| Production cost of crucible |  | Δ | ○○ | ○○ | ○○ |
| Vibration occurring on melt surface |  | ○ | ○○ | ○○ | ○○ |
| Average rate of single crystallization |  | 93% | 91% | 92% | 90% |
| Remarks |  | There is no problem with the performance, however, cost is higher compared with Example 1. | A transparent layer made of synthetic quartz glass is not present at the bottom, however the yield is favorable. | There is no problem. | There was no problem with the performance, however, the shape is slightly deformed and there is some concern. |

Comparative Examples 1 to 3

In Example 1, the transparent layer 5 made of natural quartz glass and the transparent layer 6 made of a synthetic quartz glass, which form the inner surface of a quartz glass crucible, were fused and integrated so as to have a thickness shown in Table 2, respectively, whereby a 24-inch quartz glass crucible was produced. The average OH group concentration in each layer of the produced quartz glass crucible was as shown in Table 2. By using this quartz glass crucible, pulling up of a silicon single crystal was carried out in the same manner as in Example 1. The results are shown in Table 2.

TABLE 2

|  |  | Comparative Example 1 | Comparative Example 2 | Comparative Example 3 |
|---|---|---|---|---|
| Transparent layer made of synthetic quartz glass | Thickness | None | 1 to 3 mm | 0 to 0.55 L: 0.9 to 0.3 mm; 0.55 to 0.6 L: 0.2 to 0.9 mm; 0.6 to 1 L: 0.1 to 0.2 mm |
|  | OH group | — | 220 ppm | 220 ppm |
| Transparent inner layer made of natural quartz glass | Thickness | 1 to 3 mm | None | None |
|  | OH group | 110 ppm | — | — |
| Opaque outer layer made of natural quartz glass | Thickness | 8 to 10 mm | 8 to 10 mm | 8 to 10 mm |
|  | OH group | 40 ppm | 40 ppm | 40 ppm |
| Number of pulling up operations |  | 5 | 5 | 5 |
| Production cost of crucible |  | ○○ | × | Δ |
| Vibration occurring on melt surface |  | ○○ | × | ○ |
| Average rate of single crystallization |  | 30% | 75% | 45% |
| Remarks |  | Disorder frequently occurred in the middle of crystalline body. Surface roughness in the crucible was significant. | Remelting was frequently performed due to vibration of the melt surface. A crack occurred between the transparent layer and the opaque layer made of natural quartz glass in the bent portion. | There was a lot in which the pulling up operation was halted due to the exposure of the opaque layer in the straight body portion. A crack similar to that of Comparative Example 2 occurred in the bent portion. |

Example 6

By using an apparatus shown in FIG. 3, natural silica powder of high purity subjected to a purification treatment was fed into a rotatable mold 8, and a quartz glass crucible-like molded article 9 was formed by utilizing centrifugal force. Then, an arc electrode 14 was inserted in the article, and the opening portion was covered with a plate-like lid 11. Then, the inside of the inner cavity was made a high temperature gas atmosphere by the arc electrode 14, melted and vitrified, whereby an opaque quartz glass outer layer 4 was produced. Subsequently, natural silica powder was fed at 100 g/min from a silica powder feeding device 10, whereby a transparent layer 5 made of natural quartz glass was fused and integrated to the inner surface of the opaque quartz glass outer layer 4. Then, a synthetic silica powder was fed at 100 g/min from a silica powder feeding device 15, and after the use in the pulling up of a silicon single crystal, a transparent layer 6 made of a synthetic quartz glass was fused and integrated to the inside of the crucible in the range from 0.5 to 1.0 M from the initial surface level of a silicon melt in terms of a length M from the initial surface level of the silicon melt to the surface level of the remaining melt after pulling up a single crystal measured along the inner surface of the quartz glass crucible, whereby a quartz glass crucible with an outer diameter of 22 inches was produced. By using this quartz glass crucible, pulling up of a silicon single crystal was carried out by the CZ method. The results of the pulling up of a silicon single crystal and the results of measuring the number of brown rings on the inner surface of the crucible are shown in Table 3.

Example 7

By using an apparatus shown in FIG. 3, natural silica powder of high purity subjected to a purification treatment was fed into a rotatable mold 8, and a crucible-like molded article 8 was formed by utilizing centrifugal force. Then, an arc electrode 14 was inserted in the article, and the opening portion was covered with a plate-like lid 11. Then, the inside of the inner cavity was made a high temperature gas atmosphere by the arc electrode 14, melted and vitrified, whereby an opaque outer layer 4 was formed. Then, a synthetic silica powder was fed at 100 g/min from a silica powder feeding device 15, whereby a transparent layer made of a synthetic quartz glass was fused and integrated to the entire inner surface of the opaque outer layer 4. Subsequently, natural silica powder was fed at 100 g/min from a silica powder feeding device 10, and after the use in the pulling up of a silicon single crystal, a transparent layer made of natural quartz glass was fused and integrated to the inside of the crucible in the range from the initial surface level of a silicon melt to 0.4 M in terms of a length M from the initial surface level of the silicon melt to the surface level of the remaining melt after pulling up a single crystal measured along the inner surface of the quartz glass crucible, whereby a quartz glass crucible with an outer diameter of 22 inches was produced. By using this quartz glass crucible, pulling up of a silicon single crystal was carried out by the CZ method. The results of the pulling up of a silicon single crystal and the results of measuring the number of brown rings on the inner surface of the crucible are shown in Table 3.

Example 8

By using an apparatus shown in FIG. 3, natural silica powder of high purity subjected to a purification treatment was fed into a rotatable mold 8, and a crucible-like molded article 9 was formed by utilizing centrifugal force. Then, an arc electrode 14 was inserted in the article, and the opening portion was covered with a plate-like lid 11. Then, the inside of the inner cavity was made a high temperature gas atmosphere by the arc electrode 14, melted and vitrified, whereby an opaque outer layer 4 was formed. Then, a synthetic silica powder was fed at 100 g/min from a silica powder feeding device 15, and a transparent layer made of a synthetic quartz glass was fused and integrated to the entire inner surface of the opaque outer layer 4, whereby a quartz glass crucible with an outer diameter of 22 inches was produced. Further, the region which is the upper straight body portion 3 of the above-mentioned crucible and in the range from the initial surface level of the silicon melt to 0.35 M was subjected to an etching treatment with 50% HF for 30 minutes as well as a standard HF washing. By using this quartz glass crucible, pulling up of a silicon single crystal was carried out by the CZ method. The results of the pulling up of a silicon single crystal and the results of measuring the number of brown rings on the inner surface of the crucible are shown in Table 3.

Comparative Example 4

By using an apparatus shown in FIG. 3, natural silica powder of high purity subjected to a purification treatment was fed into a rotatable mold 8, and a crucible-like molded article 9 was formed by utilizing centrifugal force. Then, an arc electrode 14 was inserted in the article, and the opening portion was covered with a plate-like lid 11. Then, the inside of the inner cavity was made a high temperature gas atmosphere by the arc electrode 14, melted and vitrified, whereby an opaque outer layer 4 was formed. Then, a synthetic silica powder was fed at 100 g/min from a silica powder feeding device 15, and a transparent layer made of a synthetic quartz glass was fused and integrated to the entire inner surface of the opaque outer layer 4, whereby a quartz glass crucible with an outer diameter of 22 inches was produced. By using this quartz glass crucible, pulling up of a silicon single crystal was carried out by the CZ method. The results of the pulling up of a silicon single crystal and the results of measuring the number of brown rings on the inner surface of the crucible are shown in Table 3.

Comparative Example 5

By using an apparatus shown in FIG. 3, natural silica powder of high purity subjected to a purification treatment was fed into a rotatable mold 8, and a crucible-like molded article 9 was formed by utilizing centrifugal force. Then, an arc electrode 14 was inserted in the article, and the opening portion was covered with a plate-like lid 11. Then, the inside of the inner cavity was made a high temperature gas atmosphere by the arc electrode 14, melted and vitrified, whereby an opaque outer layer was formed. Then, natural silica powder was fed at 100 g/min from a silica powder feeding device 10, and a transparent layer made of natural quartz glass was fused and integrated to the entire inner surface of the opaque outer layer 4, whereby a quartz glass crucible with an outer diameter of 22 inches was produced. By using this quartz glass crucible, pulling up of a silicon single crystal was carried out by the CZ method. The results of the pulling up of a silicon single crystal and the results of measuring the number of brown rings on the inner surface of the crucible are shown in Table 3.

TABLE 3

| | Number | Vibration of melt | Average rate of single crystallization | Number of brown rings A in the range from the initial surface level of the melt to 0.3 M | Number of brown rings B in the range up to 0.3 M above the surface level of the remaining melt | A/B |
|---|---|---|---|---|---|---|
| Example 6 | 5 | None | 93% | 2.22 | 0.62 | 3.6 |
| Example 7 | 5 | None | 89% | 2.03 | 0.91 | 2.2 |
| Example 8 | 5 | There is small vibration, however, there is no operational problem | 92% | 1.64 | 0.64 | 2.6 |
| Comparative Example 4 | 5 | Loss of time is great due to vibration. | 79% | 0.52 | 0.66 | 0.8 |
| Comparative Example 5 | 5 | None | 48% | 2.33 | 2.42 | 1.0 |

As is clear from the results shown in Table 3, in the second quartz glass crucible of the present invention, vibration of a silicon melt did not occur, even if it occurred, it occurred at a level without causing any operational problem, and the rate of single crystallization was good. On the contrary, in the conventional quartz glass crucible as shown in Comparative Example 4, since disorder frequently occurred at the time of seeding or shoulder formation due to vibration of a silicon melt, Loss of time was great due to melt back and the operating time was longer. As a result, in the above-mentioned conventional quartz glass crucible, though the number of brown rings was small, they became large in size, and the occurrence frequency of glass dissolving surface was increased, therefore the rate of single crystallization became low. Further, in the crucible having a transparent layer made of natural quartz glass as shown in Comparative Example 5, vibration of a silicon melt did not occur, however, the number of brown rings in the vicinity of the remaining melt was large, glass dissolving surface occurred at a considerably high frequency, and the rate of single crystallization was extremely low.

INDUSTRIAL APPLICABILITY

As described above, the quartz glass crucible of the present invention is useful as a quartz glass crucible for pulling up a silicon single crystal because vibration does not occur on the surface of a silicon melt, surface roughness or peel-off of the inner layer does not occur, and even if it is used for a long time, surface roughness of the inner surface or peel-off of the inner layer does not occur, and pulling up of a silicon single crystal can be stably carried out for a long time.

The invention claimed is:

1. A quartz glass crucible for pulling up a silicon single crystal, comprising:
 a quartz glass crucible body having a hollow cylindrical top portion forming an opening into the quartz glass crucible, a bottom portion forming a circular depression with a centrally-located bottom dead center point and a bent portion interconnecting the top portion and the bottom portion to form an inside surface of the quartz glass crucible body, the quartz glass crucible body having an opaque outer layer formed by melting natural silica powder and a transparent layer structure formed on the inside thereof, characterized in that the transparent layer structure includes a transparent layer made of natural quartz glass with a thickness of 0.4 to 5.0 mm covering the entirety of the inside of the opaque outer layer, and a transparent layer made of a synthetic quartz glass having a lower transparent layer portion and an upper transparent layer portion, the lower transparent layer portion formed on and covering a lower portion of the transparent layer made of the natural quartz glass of the inside of the crucible and having:
 a thickness extending in a range from 0.15 to 0.55 L selected from a thickness range of 0.2 to 1.5 mm,
 the upper transparent layer portion having a thickness of 0.1 mm or less and formed on and covering an upper portion of the transparent layer made of the natural quartz glass of the inside of the crucible in a range from 0.6 to 1.0 L,
 wherein L is a distance extending along the inside surface of the quartz glass crucible body, as viewed in cross-section, from the bottom dead center point to the opening into the quartz glass crucible body and
 wherein the range of 0.15 to 0.55 L is inclusive of the bottom portion and the bent portion and is exclusive of the top portion.

2. The quartz glass crucible for pulling up a silicon single crystal according to claim 1, characterized in that an average OH group concentration CA in the transparent layer made of a synthetic quartz glass is from 100 to 300 ppm, an average OH group concentration $C_B$ in the transparent layer made of natural quartz glass is from 60 to 150 ppm, an average OH group concentration $C_C$ in the opaque outer layer made of natural quartz glass is from 20 to 60 ppm, and they satisfy the relation: $CA > C_B > C_C$.

3. A method for producing a quartz glass crucible for pulling up a silicon single crystal according to claim 1, characterized by making an inner cavity of a quartz glass crucible base body mounted on a rotatable mold a high temperature atmosphere, feeding natural silica powder to the high temperature atmosphere in the inside of an opaque outer layer after or during the formation of the opaque outer layer by partially melting the inner cavity to form the transparent layer made of natural quartz glass on the entire inner surface of the opaque outer layer by melting and vitrifying the natural silica powder, and then feeding a synthetic silica powder and melting and vitrifying the synthetic silica powder to form the transparent layer made of a synthetic quartz glass on the inside of the crucible in the range from at least 0.15 to 0.55 L in terms of a distance L from the center of the bottom of the inner surface of the quartz glass crucible having the transparent layer made of natural quartz glass to the upper end face along the inner surface of the crucible.

4. A quartz glass crucible for pulling up a silicon single crystal, said quartz glass crucible having an opaque outer layer made of natural quartz glass and a transparent layer formed on the inside thereof, characterized in that the number of brown rings per unit area (cm$^2$) observed in the range from the initial surface level of a silicon melt to 0.3 M in terms of a length M from the initial surface level of the silicon melt to the surface level of the remaining melt after pulling up a single crystal measured along the inner surface of the quartz glass crucible is 1.8-fold or more greater than the number of brown rings observed in the range up to 0.3 M above the surface level of the remaining melt.

5. The quartz glass crucible for pulling up a silicon single crystal according to claim 4, characterized in that the number of brown rings per unit area (cm$^2$) observed in the range from the initial surface level of a melt to 0.3 M is 2.5-fold or more greater than the number of brown rings observed in the range up to 0.3 M above the surface level of the remaining melt.

6. The quartz glass crucible for pulling up a silicon single crystal according to claim 4, said quartz glass crucible having an opaque outer layer made of natural quartz glass and a transparent layer formed on the inside thereof, characterized in that a transparent layer made of natural quartz glass or a mixture of natural and synthetic quartz glasses is formed on the inner surface of the crucible in the range from the initial surface level of a silicon melt to 0.3 M in terms of a length M from the initial surface level of the silicon melt to the surface level of the remaining melt after pulling up a single crystal measured along the inner surface of the quartz glass crucible, a transparent layer made of a synthetic quartz glass is formed on the inner surface of the crucible in the range up to 0.3 M above the surface level of the remaining melt, and the number of brown rings per unit area (cm$^2$) observed in the range from the initial surface level of the melt to 0.3 M is 1.8-fold or more greater than the number of brown rings observed in the range up to 0.3 M above the surface level of the remaining melt.

7. The quartz glass crucible for pulling up a silicon single crystal according to claim 6, characterized in that the number of brown rings per unit area (cm$^2$) observed in the range from the initial surface level of a melt to 0.3 M is 2.5-fold or more greater than the number of brown rings observed in the range up to 0.3 M above the surface level of the remaining melt.

8. The quartz glass crucible for pulling up a silicon single crystal according to claim 4, said quartz glass crucible having an opaque outer layer made of natural quartz glass and a transparent layer formed on the inside thereof, characterized in that the inner surface of the crucible in the range from the initial surface level of a melt to 0.3 M is subjected to an etching treatment or a sandblast process, and the number of brown rings per unit area (cm$^2$) observed in the range after it is used for pulling up a silicon single crystal is 1.8-fold or more greater than the number of brown rings observed in the range up to 0.3 M above the surface level of the remaining melt which is not subjected to the etching treatment or the sandblast process.

9. The quartz glass crucible for pulling up a silicon single crystal according to claim 8, characterized in that the number of brown rings per unit area (cm$^2$) observed in the range from the initial surface level of a melt to 0.3 M is 2.5-fold or more greater than the number of brown rings observed in the range up to 0.3 M above the surface level of the remaining melt.

10. The quartz glass crucible for pulling up a silicon single crystal according to claim 4, characterized in that the number of brown rings observed in the range up to 0.3 M above the surface level of the remaining melt is 0.02 to 0.9/cm$^2$.

11. The quartz glass crucible for pulling up a silicon single crystal according to claim 4, characterized in that the number of brown rings per unit area (cm$^2$) observed in the range from the initial surface level of a melt to 0.3 M is 2.0 to 5.0/cm$^2$.

12. A method for producing a quartz glass crucible for pulling up a silicon single crystal according to claim 4, characterized by making an inner cavity of a quartz glass crucible base body mounted on a rotatable mold a high temperature atmosphere, feeding natural silica powder or a powder mixture of natural and synthetic silicas to the high temperature atmosphere in the inside of an opaque outer layer after or during the formation of the opaque outer layer by partially melting the inner cavity to form a transparent layer made of natural quartz glass or a mixture of natural and synthetic quartz glasses in the range from the initial surface level of a melt to 0.3 M by melting and vitrifying the natural silica powder or the powder mixture of natural and synthetic silicas, and then feeding a synthetic silica powder and melting and vitrifying the synthetic silica powder to form a transparent layer made of a synthetic quartz glass on the inner surface of the crucible in the range up to 0.3 M above the surface level of the remaining melt.

* * * * *